VARIABLE FREQUENCY CRYSTAL-CONTROLLED OSCILLATOR

Filed April 2, 1962 2 Sheets-Sheet 1

INVENTORS.
MARTIN FISCHMAN
EDWARD A. MURPHY
BY Theodore Jay Jr.
ATTORNEY

VARIABLE FREQUENCY CRYSTAL-CONTROLLED OSCILLATOR

Filed April 2, 1962 2 Sheets-Sheet 2

INVENTORS.
MARTIN FISCHMAN
EDWARD A. MURPHY
BY Theodore Jay Jr.
ATTORNEY

United States Patent Office 3,163,831

Patented Dec. 29, 1964

3,163,831
VARIABLE FREQUENCY CRYSTAL-CONTROLLED OSCILLATOR

Martin Fischman, Wantagh, and Edward A. Murphy, Farmingdale, N.Y., assignors to General Telephone and Electronics Laboratories, Inc., a corporation of Delaware Filed Apr. 2, 1962, Ser. No. 184,401
3 Claims. (Cl. 331—116)

Our invention relates to electronic oscillators and more particularly is directed toward that type of electronic oscillator wherein the operating frequency can be varied in accordance with variations of a suitable control signal.

Electronic oscillators having variable operating frequencies are well known in the art. However, when the oscillator frequency must be extremely stable, it is conventional to employ a crystal-controlled oscillator. The extremely high frequency stability obtained through the use of a crystal as a frequency determining element in an oscillator, however, is counterbalanced by a concomitant disadvantage; i.e., the operating frequency of such an oscillator cannot be varied or shifted appreciably, since the crystal will cease to vibrate when such frequency shifts are attempted.

We have invented a new type of crystal-controlled oscillator wherein the oscillator frequency can be varied over a much wider range than heretofore obtainable. Moreover, in our invention accurate phase control of the oscillator frequency is also obtained. Our invention finds a wide range of circuit applications, as for example, in clock pulse regeneration for repeaters utilized in pulse code modulation systems, in synchronous detectors of pulses in telemetering systems, and the like.

In accordance with the principles of our invention, we provide an oscillator having a resonant network for determining the oscillator frequency, this network including circuit means (as for example a crystal) operative in a series resonant mode, and a capacitor connected in series with the circuit means. Further, we provide switching means having first and second mutually exclusive electric states, the switching means, when in the first state, is effectively isolated electrically from the capacitor and, when in the second state, effectively short-circuits the capacitor.

When the capacitor is short-circuited in this manner (i.e., the switching means is in the first state), the oscillator frequency has a first value which is determined by the inductance and capacitance of the circuit means alone. However, when the switching means is in the second state, and the capacitor is isolated from the switching means, the oscillator frequency has a second and higher value which is determined by the inductance of the circuit means and the combined capacitance of the circuit means and the series connected capacitor.

By operating the switching means in such manner as to periodically trigger this means first into one state, then into the other state, the capacitance of the resonant network attains an average value intermediate the capacitance of the circuit means alone and the combined capacitance of the circuit means and the capacitor. As a consequence, the oscillator frequency, which we have found is determined by the average capacitance, changes to a value intermediate the two frequency values previously described. Moreover, by controlling the total time the switching means is in one state relative to the total time the switching means is in the other state; i.e. by controlling the switching duty cycle, the average value of the capacitance can be varied, and the oscillator frequency can be varied accordingly.

Illustrative embodiments of our invention will now be described in detail with reference to the accompanying drawings wherein.

Figure 1:
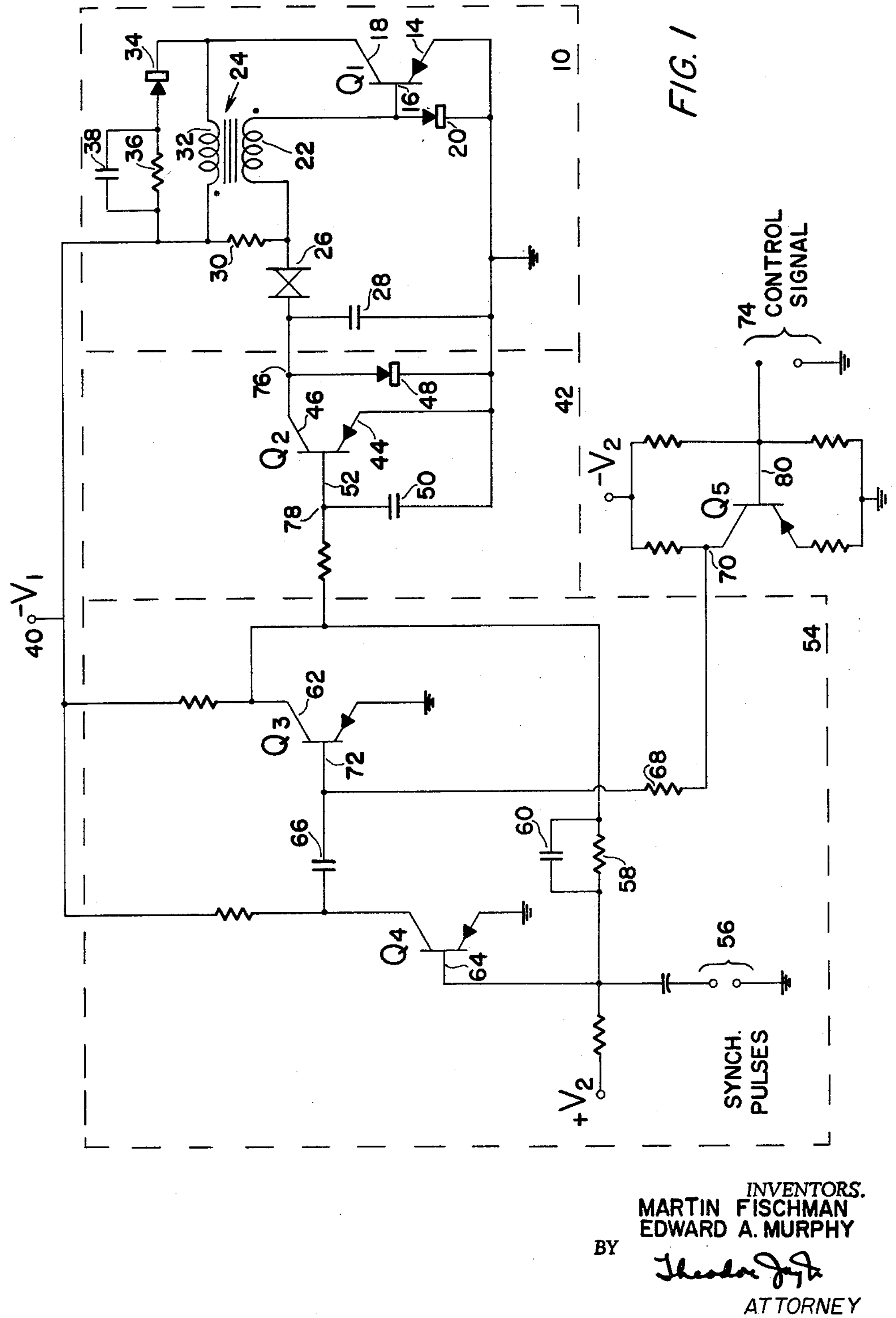
FIG. 1 is a circuit diagram of one embodiment of our invention.

Referring now to FIG. 1, a crystal controlled oscillator is identified generally within the dotted outline 10. The oscillator includes a PNP type transistor Q1 having an emitter 14, a base electrode 16 and a collector 18. Emitter 14 is grounded. The base electrode 16 is connected through diode 20 to the emitter 14. (Diode 20 is poled to pass current from the base electrode 16 to the emitter 14.) In addition, base electrode 16 is connected to ground through a resonant network including in series connection, a first winding 22 of transformer 24, a crystal 26 operative in a series resonant mode, and a capacitor 28. A potential of $-V_1$ volts is applied from terminal 40 through resistor 30 and winding 22 to the base electrode 16, and through a second winding 32 of transformer 24 to the collector 18. A network, consisting of a diode 34 connected in series with the paralleled combination of resistor 36 and capacitor 38, is shunted across winding 32. (Diode 34 is poled to pass current from terminal 40 to collector 18.)

When the oscillator is functioning under steady state conditions, an output voltage appears between collector 18 and ground. This voltage takes the form of a symmetrical square wave, the fundamental frequency of which is determined by the resonant network. (Alternatively, the transformer 24 can have a third winding electromagnetically coupled to one of the other windings, in which case the output voltage can appear across the third winding.) A large sinusoidal current at this fundamental frequency circulates in the resonant network. During a first half cycle at this frequency, diode 20 conducts and essentially no current flows from the emitter 14 to the base electrode 16. Transistor Q1 is then non-conductive. The current flow during this half cycle through winding 22 induces a voltage across winding 32 of such polarity as to cause diode 34 to conduct. Under these conditions, the paralleled capacitor 38 and resistor 36 are connected effectively in parallel with winding 32, reducing the combined impedance to a very low value. The resulting reflected impedance as developed in winding 22 is also extremely low, whereby the circulating sinusoidal current has a high value.

As the first half cycle is completed and the second half cycle of operation begins, the circulating current reverses its direction, and diode 20 is rendered non-conductive. However, this reversed current begins to flow from the emitter 14 to the base electrode 16; due to the coupling and polarities of windings 22 and 32, an amplified current begins to flow from the collector 18 to the base electrode 16. Since the current flowing into the base electrode from the emitter is in phase with the current flow into the base electrode from the collector, a positive current feedback loop is established. As a result, the transistor base current builds up extremely rapidly until transistor Q1 is conducting in the saturation region of its current-voltage characteristic. As long as the transistor is operating in this region, the collector current is independent of the base current, and the transistor voltages remain effectively constant (the transistor has no dynamic gain when operating in this region.) Further, while the reversal of current cuts diode 34 off so that the paralleled resistor 36 and capacitor 38 no longer reduce the impedance of winding 32, the emitter-collector path of transistor Q1 represents a very low impedance path during this period; consequently, winding 32 is effectively short-circuited (with respect to alternating current) during this half cycle. Hence, the impedance reflected into winding 22 during this half cycle remains extremely low, and the circulating sinusoidal current remains high in value.

At the end of this half cycle, the circulating sinusoidal current in the resonant network again reverses, and the transistor is rapidly driven out of saturation to cut-off.

More details on the operation of this type oscillator will be found in the copending patent application of Martin Fischman, Serial No. 153,947, filed November 21, 1961.

Because of the extremely high Q of the crystal (which has, for example, a resonant frequency of 1,950,050 cycles per second), if capacitor 28 is short-circuited, the oscillator frequency will be 1,950,050 with a bandwidth of about 30 cycles per second.

When capacitor 28 is in the circuit, the frequency of oscillation, due to the change in capacitance of the network, will be increased (depending upon the value of capacitor 28), for example to 1,952,174 cycles per second. Again, however, the bandwidth remains about 30 cycles per second.

We have discovered that by periodically short-circuiting and unshorting capacitor 28 for short intervals of time (compared to the response time of the crystal, i.e. 1/30 c.p.s.), the average value of capacitance of the resonant network can be changed, and further, that the oscillator frequency is determined by the average value of the capacitance under these conditions. The Q of the circuit is extremely high in both the shorted and unshorted conditions. This permits the sinusoidal circulating current to build up to a high value in order to provide adequate base drive.

Hence, we provide switching means for controlling the average capacitance of the resonant network. In FIG. 1, this means (indicated generally within the dotted line 42) comprises a second transistor Q2 having an emitter 44 coupled to one terminal of capacitor 28 and a collector 46 coupled to the other terminal of capacitor 28. A diode 48 is connected between emitter 44 and collector 46 and is poled to pass current from the collector 46 to the emitter 44 when the potential on the collector is positive with respect to that on the emitter. A capacitor 50 is coupled between the base electrode 52 and the emitter 44 of transistor Q2.

The circulating current, being sinusoidal, on one half cycle, causes the potential of collector 46 to be negative with respect to ground and on the next half cycle to be positive with respect to ground. If the potential on base electrode 52 falls below ground potential, transistor Q2 will conduct in its saturation mode during the one half cycle and short-circuit capacitor 28. During the next half cycle, diode 48 will conduct and the capacitor will remain short-circuited. In other words, with a negative potential on base electrode 52, transistor Q2 and diode 48 are rendered alternatively conductive on alternate half cycles, and capacitor 28 will be short-circuited by either the transistor or the diode.

When the potential on base electrode 52 rises with respect to ground, transistor Q2 is cut off. Under these conditions, during the half cycle of the circulating current that collector 46 is negative with respect to ground, diode 48 is also non-conductive, and capacitor 28 is not short-circuited. During the next half cycle, diode 48 conducts momentarily, but capacitor 28 charges to the peak value of the sine wave, and only a minute current flows through the diode for an instant during the positive peak of the since wave. Hence, when transistor Q2 is cut off, diode 48 is effectively nonconductive.

(Note that if the driving power for operating transistor Q2 is sufficiently high, the transistor Q2 can provide bilateral switching action; i.e. the emitter and collector can interchange functions when the circulating current reverse direction. Under these conditions, diode 48 can be eliminated.)

The potential on the base electrode 52 of transistor Q2 is controlled by the operation of a monostable multivibrator comprising transistors Q3 and Q4 (both PNP types) and identified generally within the dotted line 54. In the absence of any control pulse at terminals 56, transistor Q4 is non-conductive, and transistor Q3 is conductive. When transistor Q3 is conductive, transistor Q2 is non-conductive and capacitor 28 is connected in circuit with the crystal 26.

Upon the arrival of a negative synchronization pulse at terminals 56, transistor Q4 is triggered into conduction, cutting off transistor Q3, and applying a negative potential to base electrode 52 of transistor Q2. As long as transistor Q3 is cut off, transistor Q2 and diode 48 then alternatively short-circuit capacitor 28 in the manner previously described.

At the instant transistor Q3 is cut off, a current feedback loop is established (through resistor 58 and paralleled capacitor 60) between collector 62 of transistor Q3 and base electrode 64 of transistor Q4. Through the action of this loop, transistor Q4 continues to conduct for a selected interval after the applied pulse disappears, and transistor Q3 remains cut off for this interval. Capacitor 28 is short-circuited during this interval.

The length of this selected interval is determined both by the time constant of capacitor 66 and resistor 68 (which is determined by the values of these components and is, therefore, a circuit constant) and the potential of junction point 70. As the potential of this point increases or decreases negatively with respect to ground potential, for example by applying a direct voltage across terminals 74, the length of the interval is increased or decreased accordingly.

At the instant when transistor Q4 is triggered into conduction, capacitor 66 is fully charged and then begins to discharge through resistor 68 toward injunction point 70. The length of the selected interval is determined by the time required for capacitor 66 to discharge to a point where Q3 starts to pass current. At the end of the selected interval, the potential at base electrode 72 of transistor Q3 becomes negative with respect to ground, transistor Q3 conducts, and capacitor 28 is open circuited with respect to transistor Q2 and diode 48. At the same time, a positive going pulse is transmitted along the feedback loop to transistor Q4 to render same nonconductive.

The multivibrator then remains in the condition indicated above until the next synchronization pulse appears at terminals 56 and the entire process repeats.

Thus, the multivibrator period is determined by the recurrence frequency of a train of equidistantly spaced negative synchronization pulses supplied to terminals 56, a typical frequency being 30 kilocycles per second.

Figure 4:
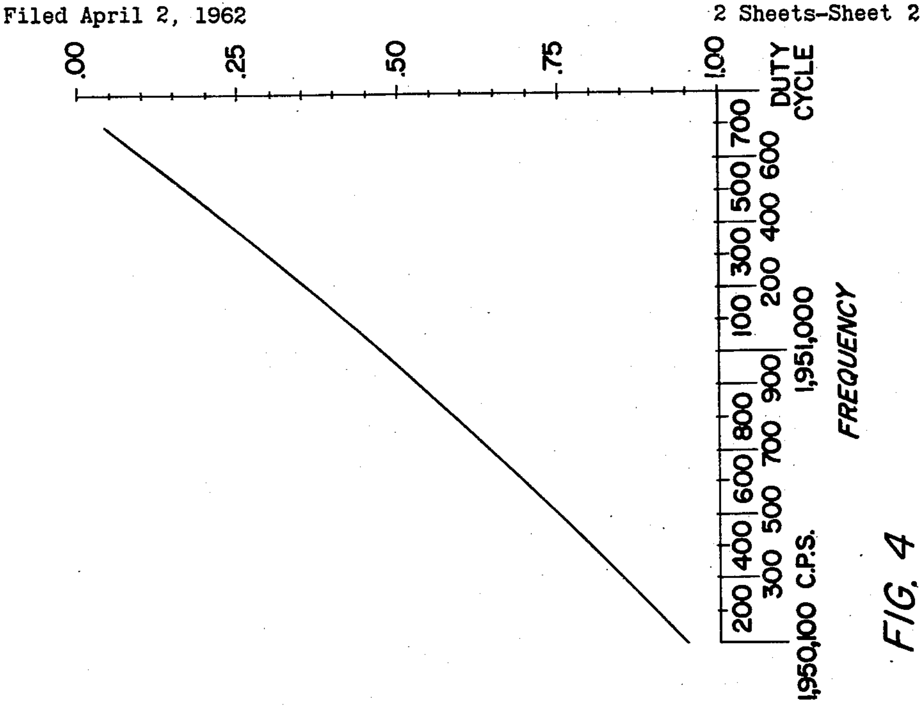
FIG. 4 is a graph illustrating the relationship between the oscillator frequency and the switching duty cycle.

The switching duty cycle is determined by the ratio (within the period of the multivibrator) of the time interval in which transistor Q3 is conductive to the time interval in which transistor Q3 is cut off. Providing the recurrence frequency of the pulse train is high with respect to the bandwidth of the crystal 26, the recurrence frequency can be varied without having any serious modulation effect on the oscillator frequency. However, the oscillator frequency (within the limits of the frequency with capacitor 28 short-circuited and the frequency with capacitor 28 open-circuited with respect to transistor Q2 and diode 48) is determined by the duty cycle as shown in FIG. 4.

Figure 2:
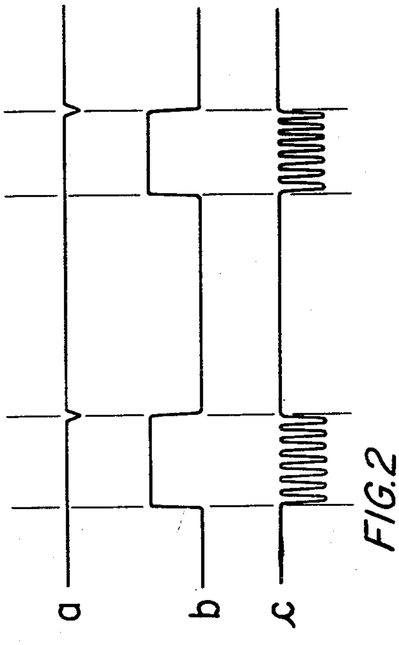
FIGS. 2 and 3 are waveforms of signals produced at various points in the circuit of FIG. 1.
Figure 3:
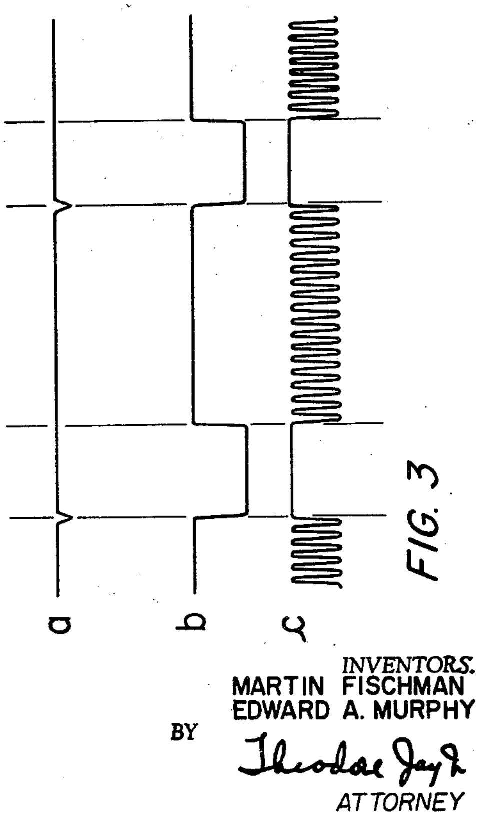

The wave forms shown in FIGS. 2 and 3 illustrate operation at different frequencies, the lower frequency being shown in FIG. 2. The wave form of the synchronization pulses applied to terminals 56 is shown at *a*; corresponding conductive and non-conductive states of transistor Q2 (as measured between point 78 and ground in FIG. 1) are shown at *b*; the corresponding voltage variations appearing across capacitor 28 (as measured between point 76 and ground in FIG. 1) are shown at *c*.

In the circuit of FIG. 1, transistors Q1–Q4 can be type 2N711; transistor Q5 can be type 2N404; and diodes 20, 34 and 48 can be type 1N179. Illustrative values (in ohms) for resistors 30, 36, 58 and 68 can be 100,000, 1000, 4700 and 22,000 respectively. Illustrative values in picofarads) for capacitors 28, 60 and 66 can be 12, 33 and 470 respectively. Capacitors 38 and 50 can have values of .01 and .001 microfarad respectively.

While we have shown and pointed out our invention as applied above, it will be apparent to those skilled in the art that many modifications can be made within the scope and sphere of our invention.

What is claimed is:

1. In an oscillator, a resonant circuit for determining the oscillator frequency by the average capacitance thereof and including a crystal operative in a series resonant mode and a capacitor in series with said crystal, said crystal having a predetermined bandwidth of frequency response which includes the series resonant frequency of the crystal transistor, switching means connected across said capacitor and having first and second mutually exclusive electric states, said switching means being effectively isolated electrically from said capacitor when in said first state and effectively short-circuiting said capacitor when in said second state, and means to supply a pulse train of equidistantly spaced pulses to said switching means, the recurrence frequency of said train being much higher than the frequency bandwidth of said crystal, said switching means, upon receiving a pulse in said train, being triggered from a selected state into the other state and thereafter being returned to the selected state within a time interval always less than the time separation between adjacent pulses in said train, said time interval controlling the duty cycle of said switching means to determine the average capacitance of said resonant circuit.

2. In an oscillator, a resonant circuit for determining the oscillator frequency by the average capacitance thereof and including a crystal operative in a series resonant mode and a capacitor in series with said crystal, said crystal having a predetermined bandwidth of frequency response which includes the series resonant frequency of the crystal, transistor switching means connected across said capacitor and having first and second mutually exclusive electric states, said switching means being effectively isolated electrically from said capacitor when in said first state and effectively short-circuiting said capacitor when in said second state, and means to supply a pulse train of equidistantly spaced pulses to said switching means, the recurrence frequency of said train being much higher than the frequency bandwidth of said crystal, said switching means, upon receiving a pulse in said train, being triggered from a selected state into the other state and thereafter being returned to the selected state within a time interval always less than the time separation between adjacent pulses in said train, said time interval controlling the duty cycle of said switching means to determine the average capacitance of said resonant circuit, and additional means coupled to said switching means to vary the length of said interval.

3. In an oscillator, a resonant circuit for determining the oscillator frequency and including a crystal operative in a series resonant mode and a capacitor in series with said crystal, said crystal having a predetermined bandwidth of frequency response which includes the series resonant frequency of the crystal, switching means comprising a diode coupled across said capacitor and a transistor having emitter, base and collector electrodes, the emitter and collector electrodes of said transistor being coupled across said capacitor, a monostable multivibrator having an input and an output, the output of said multivibrator being coupled between the base and emitter electrodes of said transistor, and means to supply a pulse train of equidistantly spaced pulses to the input of said multivibrator, the recurrence frequency of said train being much higher than the frequency bandwidth of said crystal, said multivibrator, upon receiving a pulse in said train, being triggered from a selected state into the other state and thereafter being returned to the selected state within a time interval always less than the time separation between adjacent pulses in said train, and additional means coupled to said switching means to vary the length of said interval.

References Cited in the file of this patent

UNITED STATES PATENTS

| | | |
|---|---|---|
| 2,588,551 | McCoy | Mar. 11, 1952 |
| 2,863,052 | Fraser | Dec. 2, 1958 |
| 2,925,561 | Macdonald | Feb. 16, 1960 |
| 2,930,991 | Edwards | Mar. 29, 1960 |